(12) United States Patent
Farmer et al.

(10) Patent No.: US 11,572,929 B2
(45) Date of Patent: Feb. 7, 2023

(54) VIBRATION ISOLATOR AND METHOD OF ASSEMBLY USING FLEX CIRCUITS

(71) Applicant: Raytheon Company, Waltham, MA (US)

(72) Inventors: Daniel R. Farmer, Sahuarita, AZ (US); Joshua J. Kirk, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 407 days.

(21) Appl. No.: 16/850,596

(22) Filed: Apr. 16, 2020

(65) Prior Publication Data

US 2021/0324936 A1  Oct. 21, 2021

(51) Int. Cl.
| | | |
|---|---|---|
| *F16F 15/04* | (2006.01) | |
| *H05K 7/14* | (2006.01) | |
| *F16F 7/116* | (2006.01) | |
| *H05K 1/11* | (2006.01) | |

(52) U.S. Cl.
CPC .............. *F16F 15/04* (2013.01); *F16F 7/116* (2013.01); *H05K 1/11* (2013.01); *H05K 7/1417* (2013.01); *H05K 2201/0133* (2013.01); *H05K 2201/10431* (2013.01); *H05K 2201/2045* (2013.01)

(58) Field of Classification Search
CPC .......... F16F 15/04; F16F 15/08; F16F 15/085; F16F 7/104; F16F 7/116; F16F 7/14; H05K 1/11; H05K 7/1417; H05K 2201/0133; H05K 2201/10431; H05K 2201/2045
See application file for complete search history.

(56) References Cited

U.S. PATENT DOCUMENTS

| | | | |
|---|---|---|---|
| 2,510,963 A | 6/1950 | Dibblee | |
| 4,227,038 A | 10/1980 | Mitchell | |
| 5,897,093 A | 4/1999 | Le Derf | |
| (Continued) | | | |

FOREIGN PATENT DOCUMENTS

| | | |
|---|---|---|
| EP | 0209623 A1 | 1/1987 |
| EP | 1138974 A2 | 4/2001 |
| (Continued) | | |

OTHER PUBLICATIONS

IPC-6013D, Qualification and Performance Specification for Flexible/Rigid-Flexible Printed Boards, Sep. 2017.

*Primary Examiner* — James Wu
(74) *Attorney, Agent, or Firm* — Schwegman Lundberg & Woessner, P.A.

(57) ABSTRACT

A vibration isolator and method of assembly utilize "flex circuits" to provide both vibration/shock isolation and integrated electrically isolated conductive paths to support lightweight devices (<100 grams) such as crystal oscillators, IC chips, MEMs devices and the like. Each flex circuit includes a least one polymer layer and at least one of the flex circuits includes at least one patterned conductive layer. The isolator may be integrally formed from a stack of polymer layers and patterned conductive layers to provide the plurality of flex circuits, platform and connectors. Most typically, flex circuits are Type 4 in which the multiple polymer layers have a loose leaf or bonded configuration. Flex circuits are easy to produce in large quantities at low cost with standardized and repeatable performance characteristics.

27 Claims, 13 Drawing Sheets

(56) References Cited

U.S. PATENT DOCUMENTS

| | | | | |
|---|---|---|---|---|
| 5,938,452 | A | * | 8/1999 | Wojnarowski ....... H05K 3/3436 428/209 |
| 7,418,863 | B2 | * | 9/2008 | Higuchi ............. G01C 19/5719 73/493 |
| 9,226,410 | B2 | | 12/2015 | Johnston |
| 2004/0084208 | A1 | * | 5/2004 | Ives .................... H05K 1/0271 174/260 |
| 2013/0335011 | A1 | * | 12/2013 | Bohringer .......... G01C 19/5719 73/493 |

FOREIGN PATENT DOCUMENTS

| | | |
|---|---|---|
| EP | 1304911 B1 | 9/2002 |
| WO | 2013115976 A1 | 8/2013 |

* cited by examiner

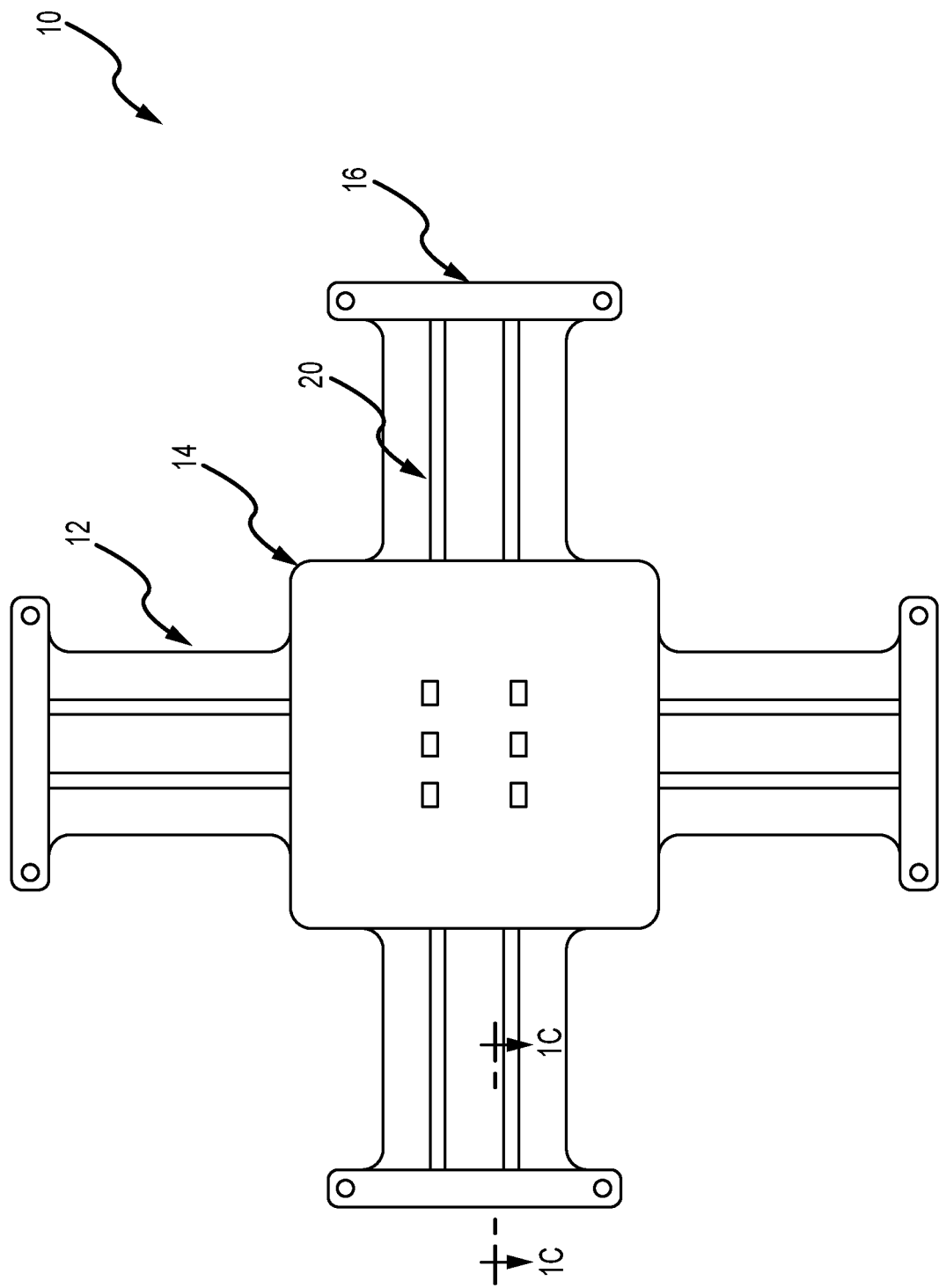

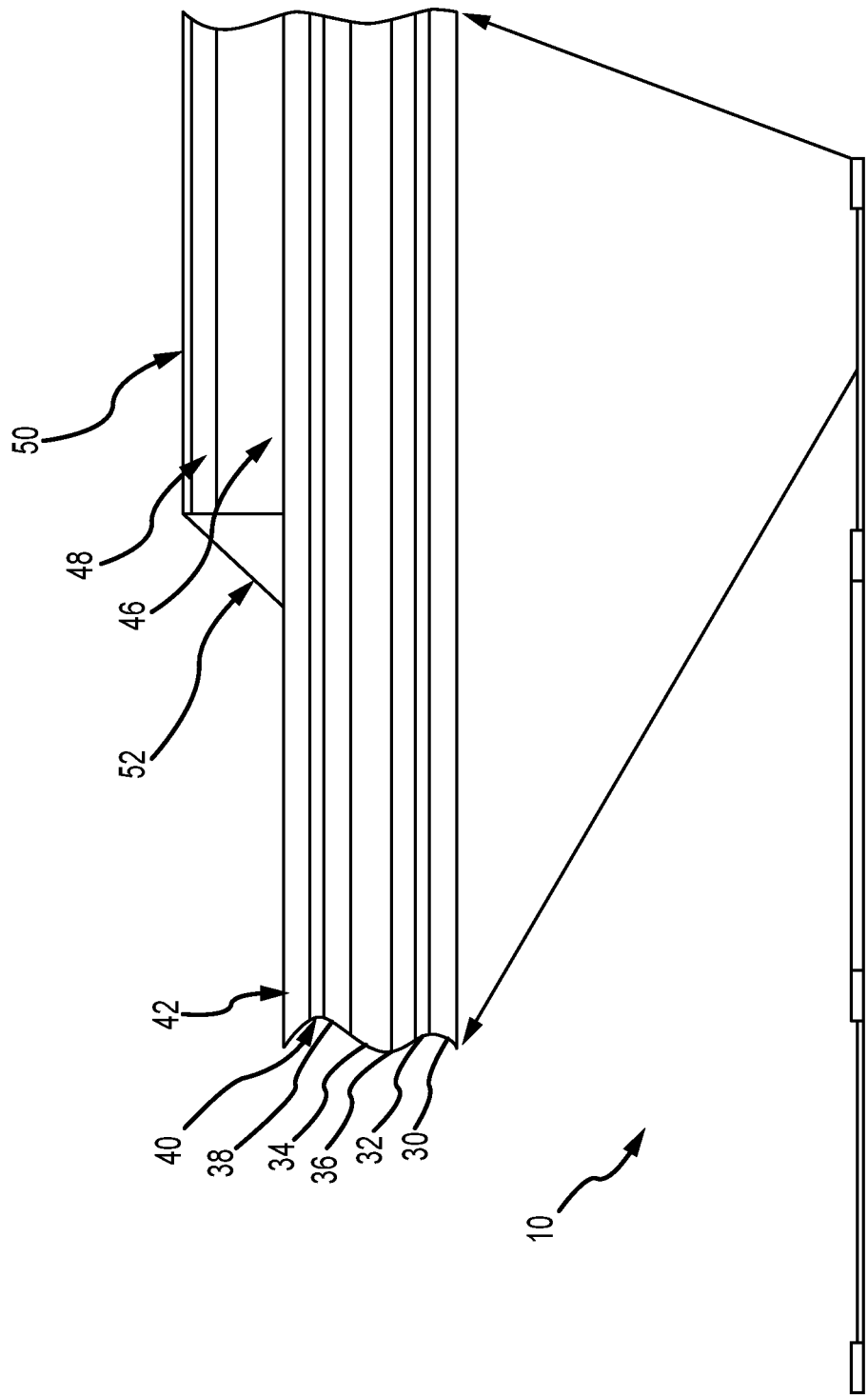

VIBRATION ISOLATOR AND METHOD OF ASSEMBLY USING FLEX CIRCUITS

BACKGROUND OF THE INVENTION

Field of the Invention

This invention relates to vibration isolators, and more particularly to vibration isolators that provide both isolation from dynamic mechanical inputs such as shock or vibration and integrated electrically isolated conductive paths for lightweight devices such as Integrated Circuit (IC) chips, crystal oscillators, microelectromechanical system (MEMs) devices and the like.

Description of the Related Art

High frequency mechanical energy e.g., shock or vibration, can damage or degrade the performance of electrical equipment or machinery. Vibration isolators have been used to mechanically isolate electric motors, generators, transformers, internal combustion engines, air compressors and the like, and also to protect fragile or sensitive equipment. The simplest vibration isolators may be implemented with a coil spring or elastomeric pad. Separate cables or wiring harnesses are typically used to bridge the isolator to bring electrical power to and electrical signals to or from the isolated device. The destructive effects of vibration and shock are well known and there have been innumerable devices proposed to address the problem. These vibration isolators can be complex, heavy, large, expensive and unreliable.

EP1138974 "Asymmetric Wire Rope Isolator and Method of Manufacture" includes a wire rope manipulated between a pair of mounting blocks so that bights of wire rope having elastic properties are formed. Four U-shaped bights are formed in a generally cloverleaf pattern about the mounting blocks. After the wire rope is secured, the four bights possess spring-like properties capable of damping vibrational energy.

U.S. Pat. No. 5,897,093 "Antivibration/Antishock Device Using Cable Segments and Stabilizer Blades" includes a support member and a supported member disposed face to face and joined by a plurality of cable segments disposed on opposite sides of the support and supported emembers. Each of the cable segments is fixed to the support member and to the supported member and extends between the support and supported members in at least a partly curved cable path. The support and supported members are also joined by at least two stabilizer blades also fixed at their ends on opposite sides of the support and supported members. The stabilizer blades have a profile substantially corresponding to that of the cable path of the cable segment.

EP Patent Application 0290623 A1 "Electrically Conductive Vibration Isolator" includes an elastomeric dome that supports an electronic element. The dome is mounted on an electrically conductive base, which is engaged with a grounded surface A flexible electrical conductor is embedded in the elastomeric dome and is connected to the base and to a grounding contact on the top of the dome. The isolator conducts electricity to ground from the electronic element while simultaneously isolating it from vibration.

U.S. Pat. No. 2,510,963 "Vibration Isolator" includes resilient bands each bent into the approximate form of a circular loop with their ends in overlapping contract relation to support a load relative to a base. A yoke straddles the circular loop to prevent the load from separating from the base in the event of failure of the loop. Since all the parts of the device are electrically conductive, there is no need to bridge a rubber or other nonconducting member with a section of cable as heretofore been necessary with many mounts on the market.

U.S. Pat. No. 4,227,038 "Vibration Isolator Connector" is directed to a vibration isolator connector which is useful in providing an electrical connection between a fixed apparatus and a suspended slender linear body which is subject to vertical vibration. The isolator comprises a weight provided with connecting means for connecting an electrical conductor to the weight. Electrically conductive resilient suspensions means are connected to the weight for resiliently suspending the weight from a linear body and forming an electrical connection between the linear body and the connecting means on the weight.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a vibration isolator and method of assembly that is useful for providing both isolation from dynamic mechanical inputs such as shock or vibration and integrated electrically isolated conductive paths for lightweight devices (<100 grams) such as IC chips, MEMs devices and the like. Isolation and electrical connectivity is provided via a plurality of "flex circuits", which may be configured to provide the mechanical support and isolation as well as electrical connectivity required for lightweight circuit devices. Flex circuits are easy to produce in large quantities at low cost with standardized and repeatable performance characteristics.

In an embodiment, a vibration isolator comprises a plurality of flex circuits, each flex circuit including at least one insulating polymer layer, and at least one of the flex circuits including a patterned conductive layer. One end of each of the flex circuits terminates in a platform that supports a supported circuit of at most 100 grams. A plurality of connectors are affixed to the opposite ends of the flex circuits, respectively, and a support structure. The flex circuits extend between the support structure and opposing sides of the platform in at least partly curved paths to provide at least two opposing bends to support the platform and provide attenuation of dynamic mechanical inputs (e.g., shock and vibration) at frequencies above an isolation frequency. The flex circuits also provide multiple electrically isolated conductive paths between the support structure and the supported circuit that carry power or at least one signal to or from the supported circuit.

In an embodiment, the flex circuits carry power from the support structure to the supported circuit and at least one signal to or from the supported circuit.

In an embodiment, the isolation frequency of the isolator is at least 50 Hz to attenuate critical frequencies above the isolation frequency. In another embodiment, the isolation frequency lies between 50 and 300 Hz.

In an embodiment, the supported circuit is at most 50 grams. In different embodiments, the supported circuit is selected from one of a crystal oscillator, an integrated circuit (IC) chip or MEMs device.

In an embodiment, each of said flex circuits has an identical composition of at least one polymer layer and at least one patterned conductive layer to exhibit the same stiffness characteristics. In an embodiment, one or more of these flex circuits are electrically inactive. In an embodiment, different flex circuits carry power to the supported circuit and the signal to and from the supported circuit. In another embodiment, at least one of the flex circuits is not provided with a patterned conductive layer, its at least one polymer layer being dimensioned to exhibit the same stiffness characteristics as the other flex circuits. In an embodiment, there are no other electrically conductive paths between the support structure and the supported circuit other than those provided by the flex circuits.

In an embodiment, the platform and each of the flex circuits are discrete components, in which the flex circuits are terminated to the platform to form the isolator.

In an embodiment, the platform and each of the plurality of flex circuits are integrally formed from a stack including at least one said polymer layer and at least one patterned conductive layer, and at least one rigid layer that defines the platform. The stack may include a rigid layer on either side of the stack. The connectors may be integrally formed as part of the isolator. In an embodiment, the flex circuits are Type 4 flex circuits that include multilayer rigid and flexible material combinations containing three or more patterned conductive layers with plated through holes (PTHs) integrally formed in the stack. The multiple polymer layers may be arranged in either a loose leaf or bonded configuration. The polymer may be selected from polyimide, polyester, Teflon, polyethylene Naphthalate (PEN), Polyethylene Terephthalate (PET) and FR4.

In either the discrete, partially or fully integrated embodiments, the flex circuits may be formed with a "planar" shape and then bent to assemble the vibration isolator on the support structure to isolate the supported circuit. Alternately, the flex circuits could be formed with a slight curvature and then further bent to assemble. Alternately, the flex circuits could be formed with the desired curvature for the assembled vibration isolator. The flex circuits are configured such that the maximum bending stress when assembled is less than the elastic limit of the flex circuit so that when disconnected the flex circuit returns to its original shape.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 1a through 1d are top, bottom, side section and exploded views of an embodiment of a flex circuit vibration isolator;

DETAILED DESCRIPTION OF THE INVENTION

Figure 1B:
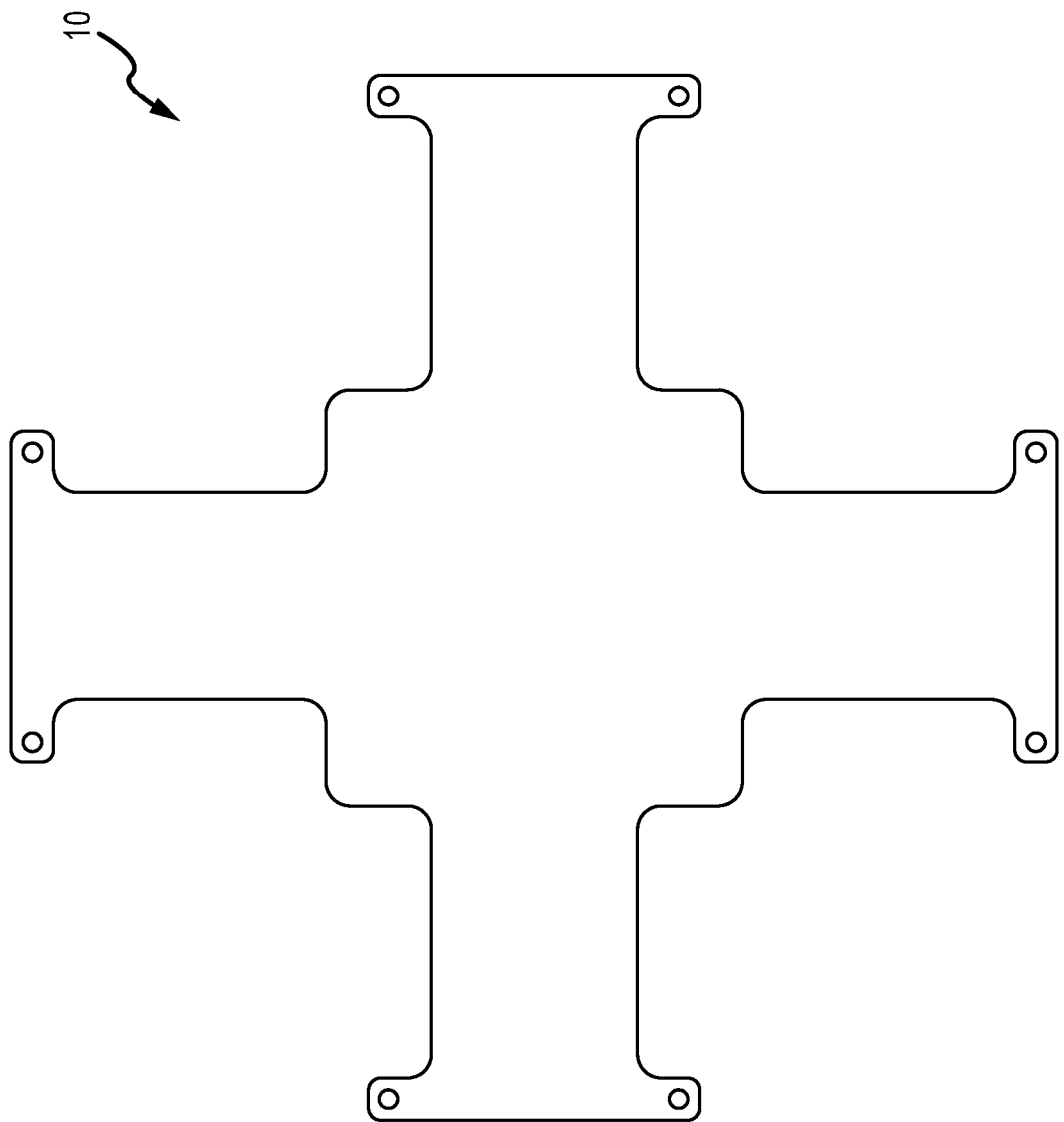

Typical vibration/shock isolators are either designed to isolate heavier loads such as electric motors, generators, transformers, internal combustion engine, air compressors and the like or to be useful for either such heavier loads or lighter weight more sensitive devices such as electrical circuits that are sensitive to dynamic environments. The same basic design is used but the parameters of, for example, the coil spring, elastomeric spacer, wire rope, cable segments, stabilizer blades or resilient bands are varied to accommodate the weight of the load and the critical frequencies of the dynamic mechanical inputs to be attenuated. Furthermore, in many typical vibration isolators electrical connectivity is either not required or provided via separate cables or wiring harnesses. A few of the vibration isolators provide limited electrically connectivity to provide a ground connection or single electrical path.

The present invention provides a vibration isolator and method of assembly that utilize "flex circuits" to provide both isolation from dynamic mechanical inputs such as shock and vibration and integrated electrically isolated conductive paths to support lightweight devices (<100 grams) such as IC chips, crystal oscillators or MEMS devices and the like. Each flex circuit includes at least one polymer layer and at least one of the flex circuits includes at least one patterned conductive layer. The isolator may be integrally formed from a stack of polymer layers and patterned conductive layers to provide the plurality of flex circuits and possibly the platform for mounting the device and connectors. Flex circuits are typically used as replacements for "wiring harnesses", in which case the flex circuits are designed to be very flexible to connect electrical devices in confined spaces and aid in heat transfer. In the present invention, the "flex circuits" are designed and configured to provide the mechanical support and isolation as well as electrical connectivity required for lightweight circuit devices. Flex circuits are easy to produce in large quantities at low cost with standardized and repeatable performance characteristics.

IPC standards are the electronics-industry-adopted standards for design, PCB manufacturing, and electronic assembly. IPC-6013D September 2017 provides standards for Qualification and Performance Specification for Flexible/Rigid-Flexible Printed Boards. Section 1.3.2 Printed Board Type—performance requirements are established for the different types of flexible printed wiring, classified as follows:

Type 1—Single-sided flexible printed boards containing one conductive layer, with or without stiffeners.

Type 2—Double-sided flexible printed boards containing two conductive layers with PTHs, with or without stiffeners.

Type 3—Multilayer flexible printed boards containing three or more conductive layers with PTHs (Printed Through Holes), with or without stiffeners.

Type 4—Multilayer rigid and flexible material combinations containing three or more conductive layers with PTHs.

Type 5—Flexible or rigid-flex printed boards containing two or more conductive layers without PTHs.

Any of these types of flexible printed boards may be used to provide the "flex circuits" for different embodiments of the vibration isolator. In some cases, a single or multilayer flexible printed board without conductive layers may be used for one or more of the flex circuits. In certain embodiments, Type 4 printed board will be the most suitable for the vibration isolator as it allows for direct integration of the platform or connectors, use of the PTHs, or surface mount and single or multiple layers of flexible legs.

The flex circuits include at least one and typically multiple polymer layers. The polymer may be selected from many materials including but not limited to polyimide, polyester, Teflon, polyethylene Naphthalate (PEN), Polyethylene Terephthalate (PET) and FR4. Polymer layers are less than 10 mils and more typically between 0.5-5 mils thick.

The flex circuits and vibration isolator may be fabricated and assembled with varying degrees of integration. At one extreme, each flex circuit, connector and the platform could be fabricated separately and then assembled to form the isolator. In another embodiment, all of the flex circuits could be fabricated from an integrated stack of polymer and patterned conductive layers and then assembled with discrete connectors and the platform. At the other extreme, the entire isolator can be integrally formed from a stack of polymer and patterned conductive layers. Integration provides several advantages including cost and matching the stiffness properties of the flex circuits. A higher level of integration is one reason that Type 4 printed boards may be preferred. The flex circuits may be fabricated in a planar (flat) configuration or with a slight bend. Alternately, they may be fabricated, for example on a mandrel, with the desired curvature for the assembled vibration isolator.

The "supported circuit" is a lightweight device of less than 100 grams. In certain cases the device may be less than 50 grams or even 10 grams. Typically devices may include ICs, a crystal oscillator, MEMs devices or the like and additional components as required to provide power forms, signal conditioning and other electrical circuit functionality. The flex circuits provide multiple electrically isolated conductive paths between the support structure and the supported circuit to carry power or at least one signal to or from the supported circuit. In certain cases, the flex circuits will carry power from the support structure to the supported circuit and multiple electrical signals to and from the supported circuit. The "supported circuit" is sensitive e.g. prone to damage or performance degradation to certain critical frequencies that lie above an isolation frequency. For these types and weight of devices, the isolation frequency is typically between 50 and 300 Hz. The critical frequencies must be attenuated to protect the device.

Referring now to FIGS. 1a through 1d, an embodiment of a vibration isolator 10 includes four flex circuits 12 spaced at ninety degrees about and terminating at a one end at a platform 14 and at the opposite end at electro-mechanical connectors 16. In this particular embodiment, the entire vibration isolator has been integrally formed from a stack including a plurality of polymer, patterned conductive and rigid layers that make up a Type 4 printed board. As fabricated, the flex circuits in this embodiment are planar (flat).

The flex circuits 12 are designed with the requisite stiffness parameter such that they can be bent without exceeding the elastic limit while supporting the weight and providing the needed isolation for the lightweight devices. The stiffness parameter will depend on the mass of the supported circuit, the mass of the rest of the system (e.g., support structure), the critical frequencies, input levels at the critical frequencies, the required attenuation thereof and other environmental factors. The stiffness is controlled by the number of layers, the width and thickness of individual layers and the total thickness, which is typically less than 30 mils.

Platform 14 is suitably a "rigid" structure on which to support the supported circuit both mechanically and electrically. A "rigid" structure is suitably in accordance with IPC-2221 and 2223 standards for printed boards. In a Type 4 printed board a rigid layer may simply be added to a center portion of the flex circuits to define the platform. The platform includes a plurality of electrical contacts 18 that are in electrical communication with the flex circuits to provide multiple electrically isolated conductive paths 20 through the flex circuits patterned conductive layers between platform 14 and connectors 16.

Figure 1D:
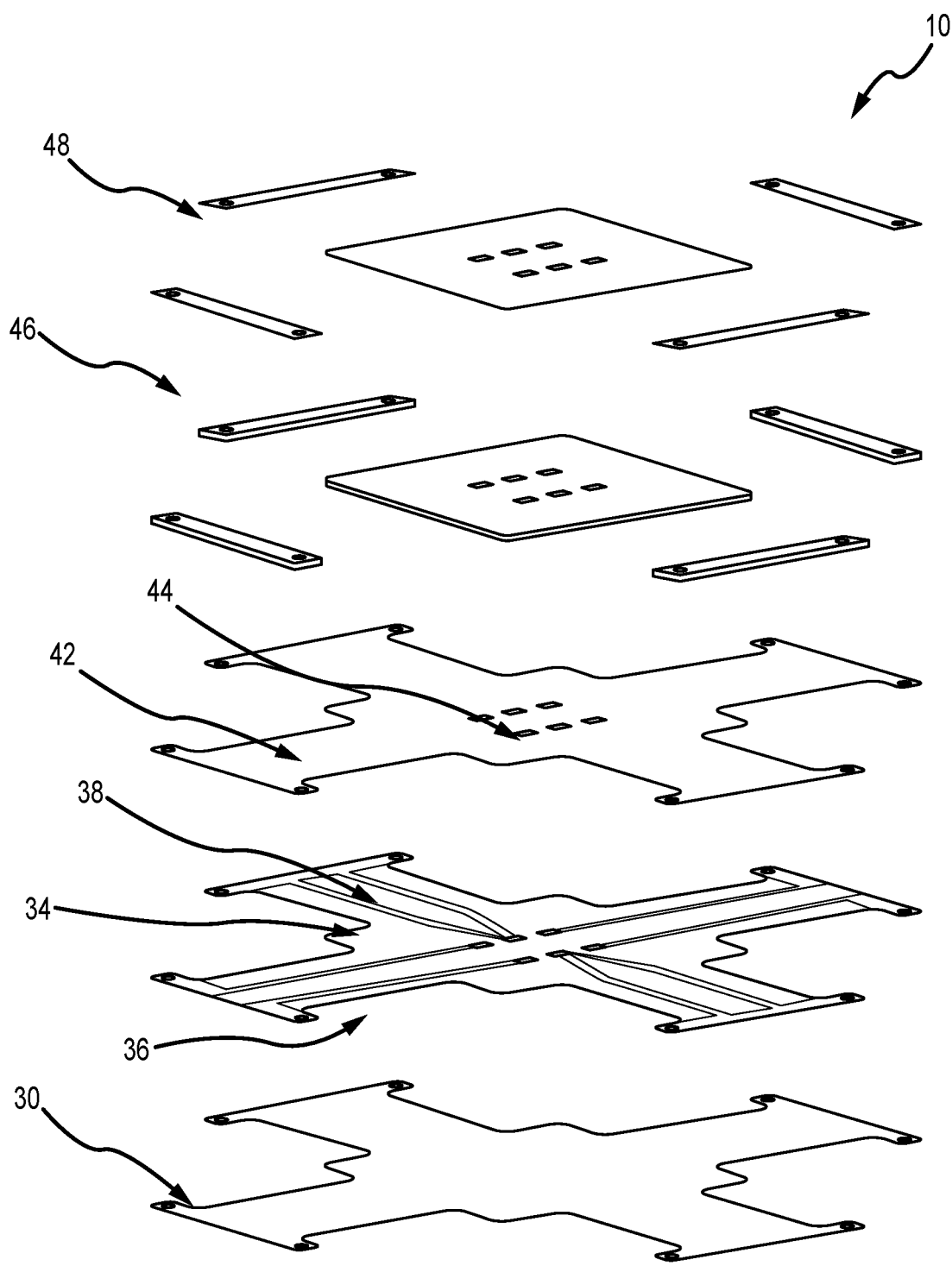

In this embodiment and as best shown in FIGS. 1c and 1d, the vibration isolator is integrally formed from Type 4 printed board in which a base polymer layer 30, typically 0.5-5 mils thick, is patterned to define an overall footprint of the isolator including all of the flex circuits, connectors and a central region for the platform. An adhesive layer 32, approximately 1 mil thick, is formed on polymer layer 30. Another polymer layer 34 with patterned conductive layers (e.g., copper) 36 and 38, typically <1 mil thick, formed on opposite sides of polymer layer 34 is formed on adhesive layer 32. The patterned conductive layers forming traces for the flex circuits and the connectors. Adhesion and polymer layers 40 and 42 are formed on top of the pattern conductive layer 38. Polymer layer 40 is patterned to define through holes 44 to access the flex circuit traces that terminate below the footprint for the platform. A rigid layer 46, suitably FR4 circuit card material (glass filled epoxy), is patterned to define platform 14 and connectors 16. A conductive layer 48 with solder mask 50 is patterned to define plated through holes (PTHs) that extend vertically to contact the traces and electrically terminate one end of the flex circuits and connector metallization that extend vertically to electrically terminate the other end of the flex circuits. The solder mask is a non-conductive layer to protect the conductive layers from oxidization and to prevent solder bridging or other inadvertent electrical contact between component leads. A fillet bead 52 is suitable formed to provide stress relief. Typically, the "flex circuit" portion of the isolator has a thickness that does not exceed 30 mils.

Although not necessary, integrated fabrication of the entire vibration isolator has certain advantages. The uniformity, particularly of stiffness characteristics, between the flex circuits can be precisely controlled. Furthermore, integration eliminates assembly of the various components, which improves reliability and reduces production costs.

Figure 2A:
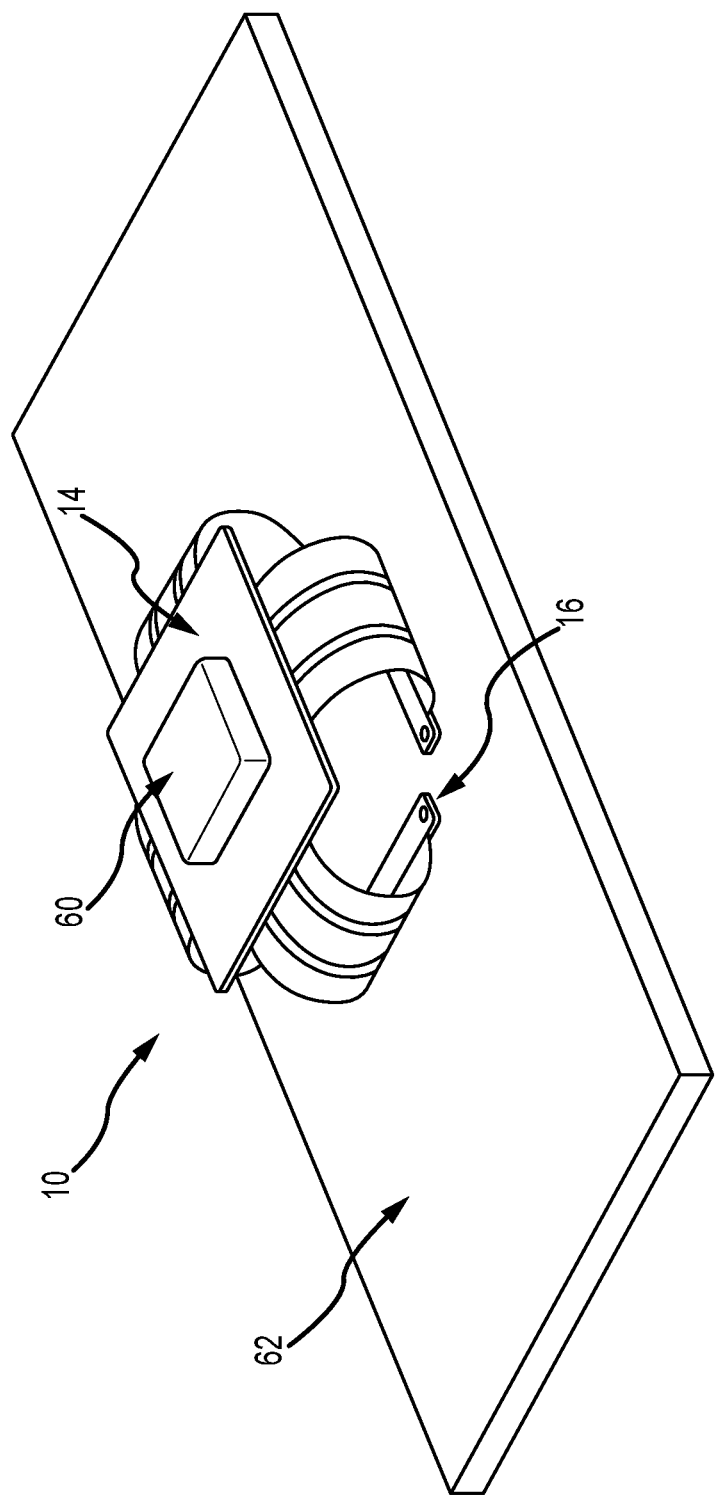
FIGS. 2a and 2b are perspective and side views of an embodiment of a flex circuit vibration isolator configured to isolate a supported circuit from a support structure.
Figure 2B:
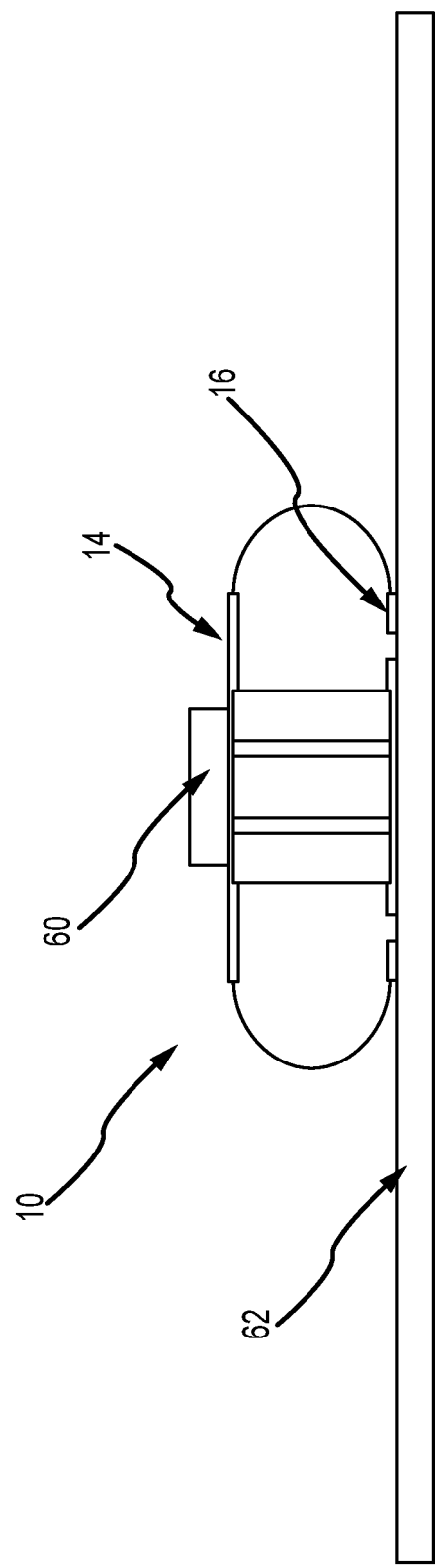

Referring now to FIGS. 2a and 2b, vibration isolator 10 is assembled to isolate a supported circuit 60 from dynamic mechanical inputs (e.g., shock or vibration) translated through a support structure 62 e.g., a rigid printed circuit board (PCB) and provide multiple electrically isolated conductive paths between the support structure and the supported circuit to provide power or at least one electrical signal there between. Supported circuit 60 is mounted on platform 14 to provide mechanical support and electrical connectivity. The flex circuit connectors 16 are connected to support structure 62 to fix one end of each flex circuit and provide electrically connectivity to, for example, a power supply or other electrical circuitry on the support structure. In this embodiment, no separate electrical connections e.g., wiring harnesses or jumpers are made between the support structure and the supported circuit.

The flex circuits 12 are bent to provide at least two opposing bends to support the platform and supported circuit. In this embodiment, each flex circuit is bent to form a "loop" that in direct opposition to the "loop" on the other side of the device. Although the flex circuits are very flexible and individually do not provide adequate mechanical support, the configuration of at least two opposing bends provides sufficient support for a lightweight device (supported circuit)<100 grams and provides sufficient attenuation of dynamic mechanical inputs above an isolation frequency. The minimum bend radius for a flex circuit is 10× for single-sided and 12× for double-sided the total thickness of the flex circuit. For dynamic systems, 20× or greater is recommended. A smaller bend radius may cause the bending stress to exceed the elastic stress limit of the flex circuit, in which case the flex circuit could deform or fail during assembly or operation and would not return to its original shape if the isolator is disassembled. For example, a 0.0010 inch (10 mil) flex circuit could have a minimum bend radius of 0.2 inches (200 mil). A typical assembled vibration isolator will exhibit an isolation frequency in the range of 50-300 Hz thereby effectively isolating the lightweight supported circuits while avoiding other low frequency system level resonances and higher frequency circuit card assembly (CCA) modes.

Figure 3:
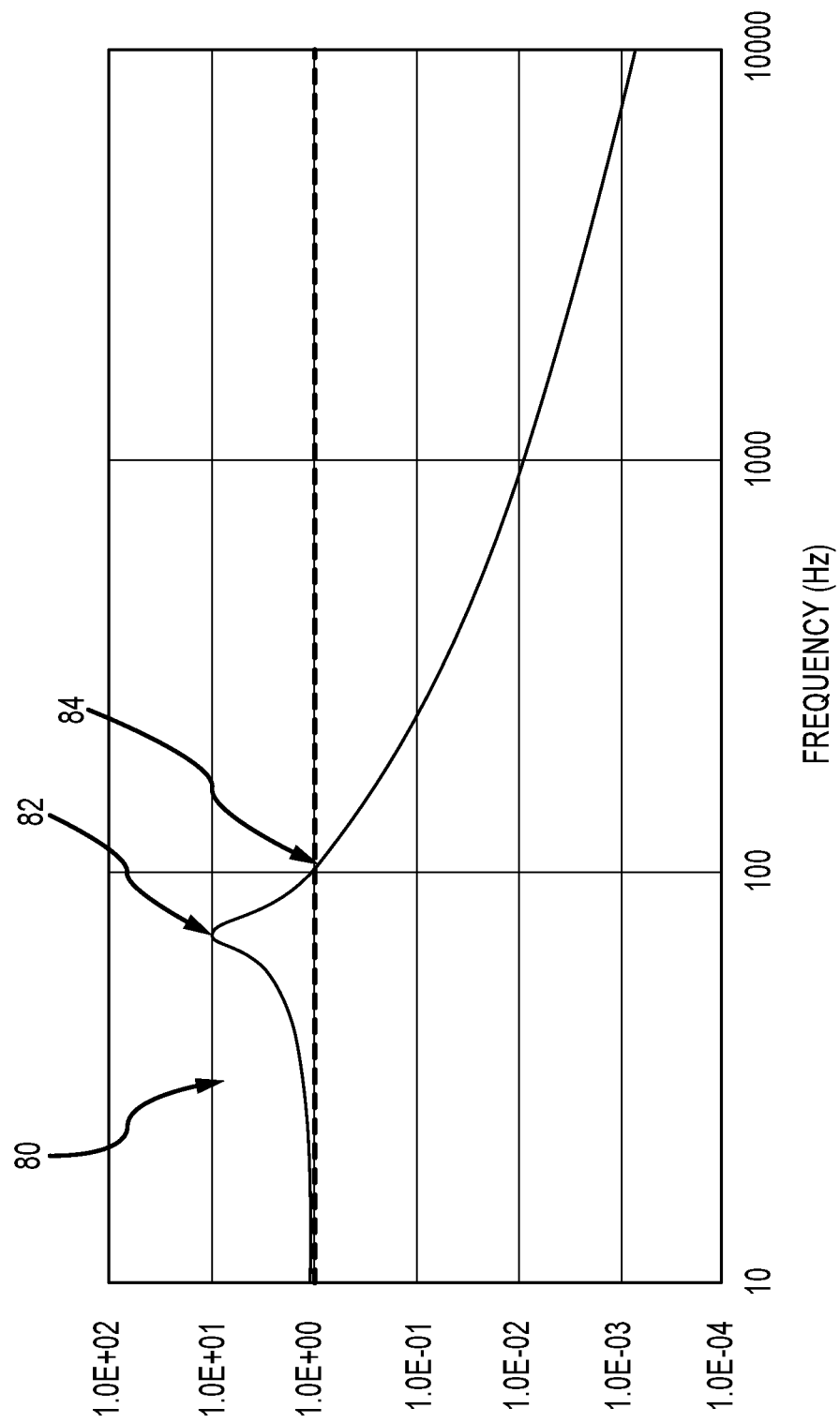
FIG. 3 is a plot illustrating attenuation provided by the flex circuit vibration isolator.

Referring now to FIG. 3, for a given "system" including the vibration isolator, supported circuit and support structure, a transfer function 80 plots a magnitude of the transfer function (ratio of energy in to versus out of the isolator) through the vibration isolator versus frequency for a unity amplitude input. An isolator is characterized by both a "resonant frequency" and an "isolation frequency". For a simple single degree of freedom (DOF) isolator, the isolation frequency is sqrt(2)*resonant frequency. For our purposes, the vibration isolator is designed for the isolation frequency. The magnitude is amplified and peaks at the resonant frequency 82 of the isolator and then falls off to provide the desired attenuation at frequencies above the isolation frequency 84.

Damping is dissipation of energy due to a force that is proportional to velocity—for this isolator system the damping is primarily due to internal friction and is dependent on the materials used in the design. Damping occurs as input energy is converted to heat within the material. Attenuation is a reduction of amplitude. Attenuation of the response at the natural frequency of the isolator is due to damping. The isolating action (attenuation at higher frequencies) is due to the inability of the isolator to transfer high frequency oscillations or energy through the flex circuits due to the inability of the flex circuits to respond quickly enough to high frequency oscillations.

Figure 4:
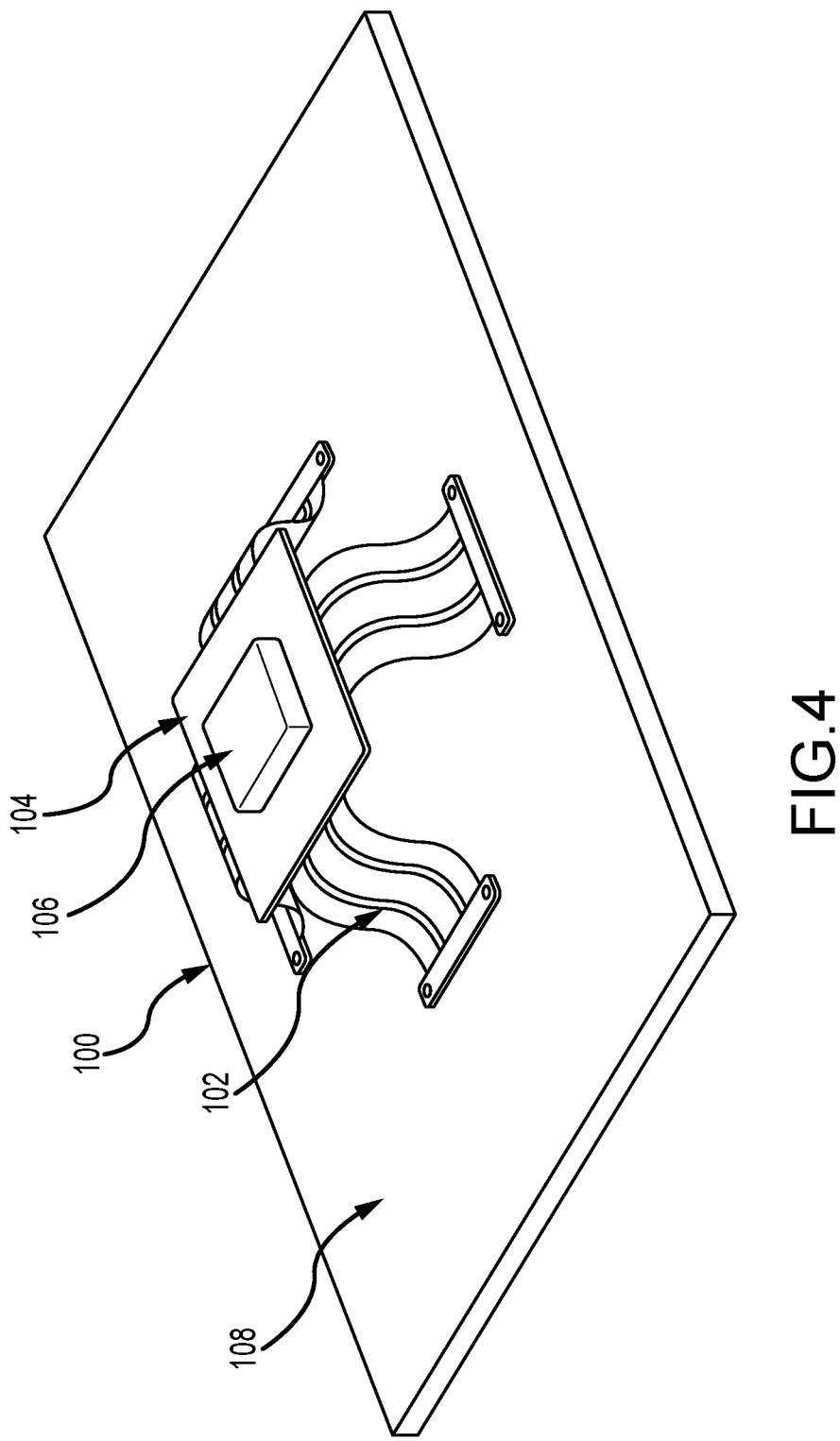
FIG. 4 is a perspective view of an alternate assembly of the flex circuit vibration isolator.

Referring now to FIG. 4, an embodiment of a vibration isolator 100 includes four flex circuits 102 that terminate at a platform 104 to isolate a supported circuit 106 from a support structure 108. In this embodiment, each flex circuit 102 is bent with an S-shape curvature to provide the at least two opposing bends to support platform 104 and supported circuit 106. Other alternate configurations are contemplated to provide the at least two opposing bends.

Figure 5:
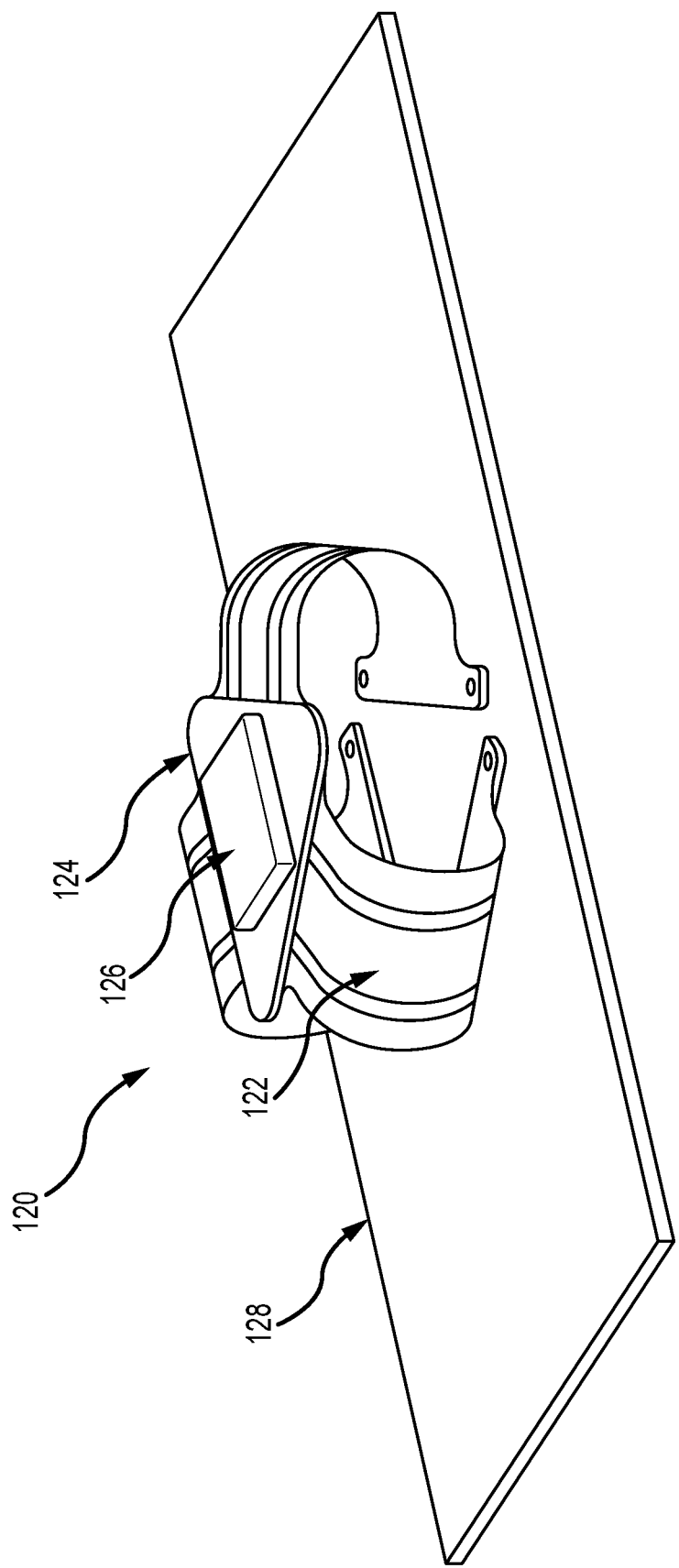
FIG. 5 is a perspective of an embodiment of a 3-legged flex circuit vibration isolator.

Referring now to FIG. 5, an embodiment of a vibration isolator 120 includes three flex circuits 122 that terminate at a platform 124 to isolate a supported circuit 126 from a support structure 128. Each flex circuit 122 is bent with a U-shape curvature or "loop" to provide the at least two opposing bends to support platform 124 and supported circuit 126. Varying configurations of two or more flex circuits are contemplated to provide the requisite at least two opposing bends to support the device.

Figure 6:
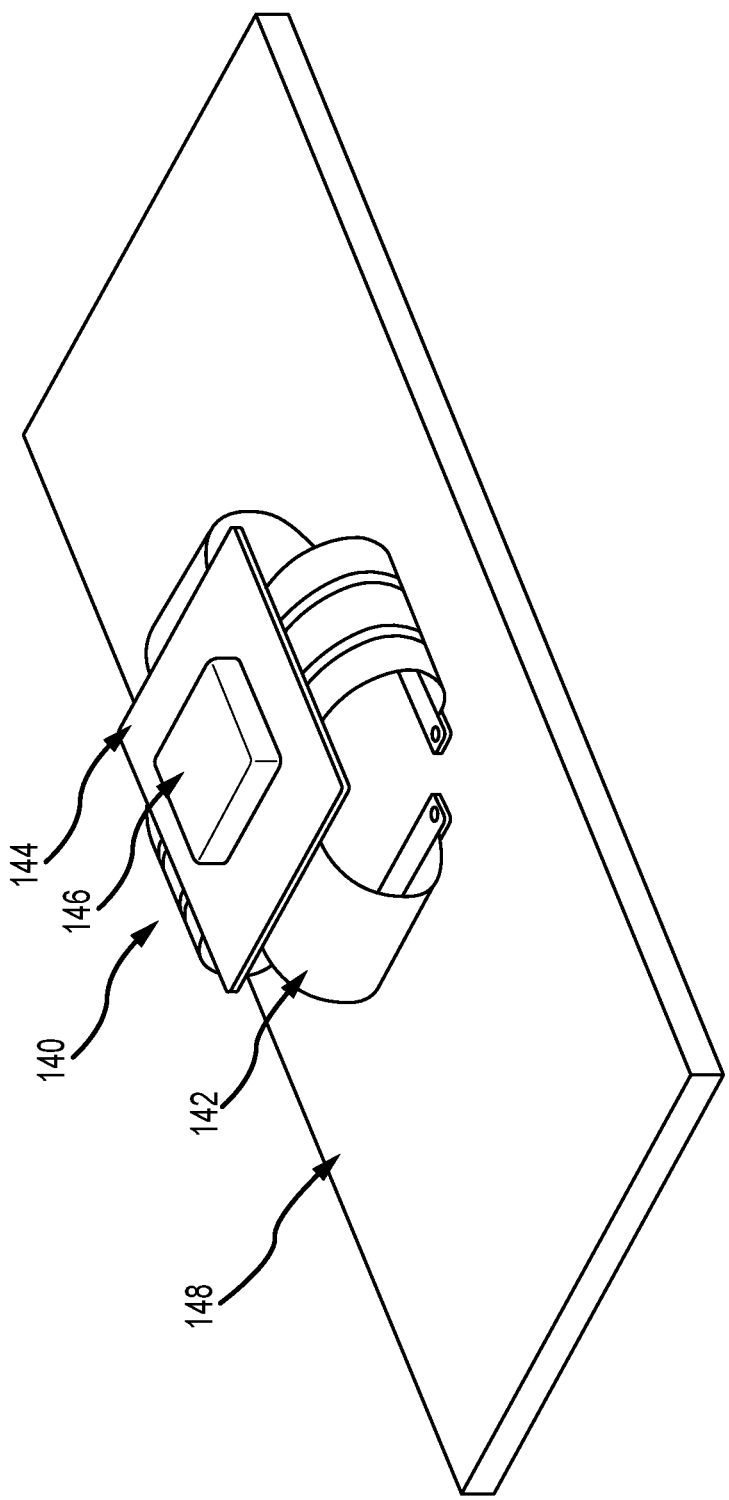
FIG. 6 is a perspective view of an alternate flex circuit vibration isolator in which two of the legs do not provide electrical circuit paths.

Referring now to FIG. 6, an embodiment of a vibration isolator 140 includes four flex circuits 142 that terminate at a platform 144 to isolate a supported circuit 146 from a support structure 148. In this embodiment, each flex circuit 142 is bent with an U-shape curvature to provide the at least two opposing bends to support platform 144 and supported circuit 146. In this example, two of the flex circuits are provided with patterned conductive layers to provide the electrically isolated conductive paths. Power and/or electrical signals may be communicated on one or both of the flex circuits. In an embodiment, power may be carried on one flex circuit and signals on the other to provide a degree of isolation. In yet another embodiment, the flex circuit may be provided with a patterned conductive layer to provide symmetry and uniform stiffness between the legs but the conductive paths are not connected e.g., inactive. In this example, to account for the missing patterned conductive layers those flex circuits may be modified e.g. changing the thickness of the polymer layers, adding or removing polymer layers, to match the stiffness properties of the flex circuits that are provided with patterned conductive layers. The flex circuits may be designed in varying ways so long as the stiffness parameters are adequate to provide required isolation and the flex circuits provide electrically isolated conductive paths.

Figure 7A:
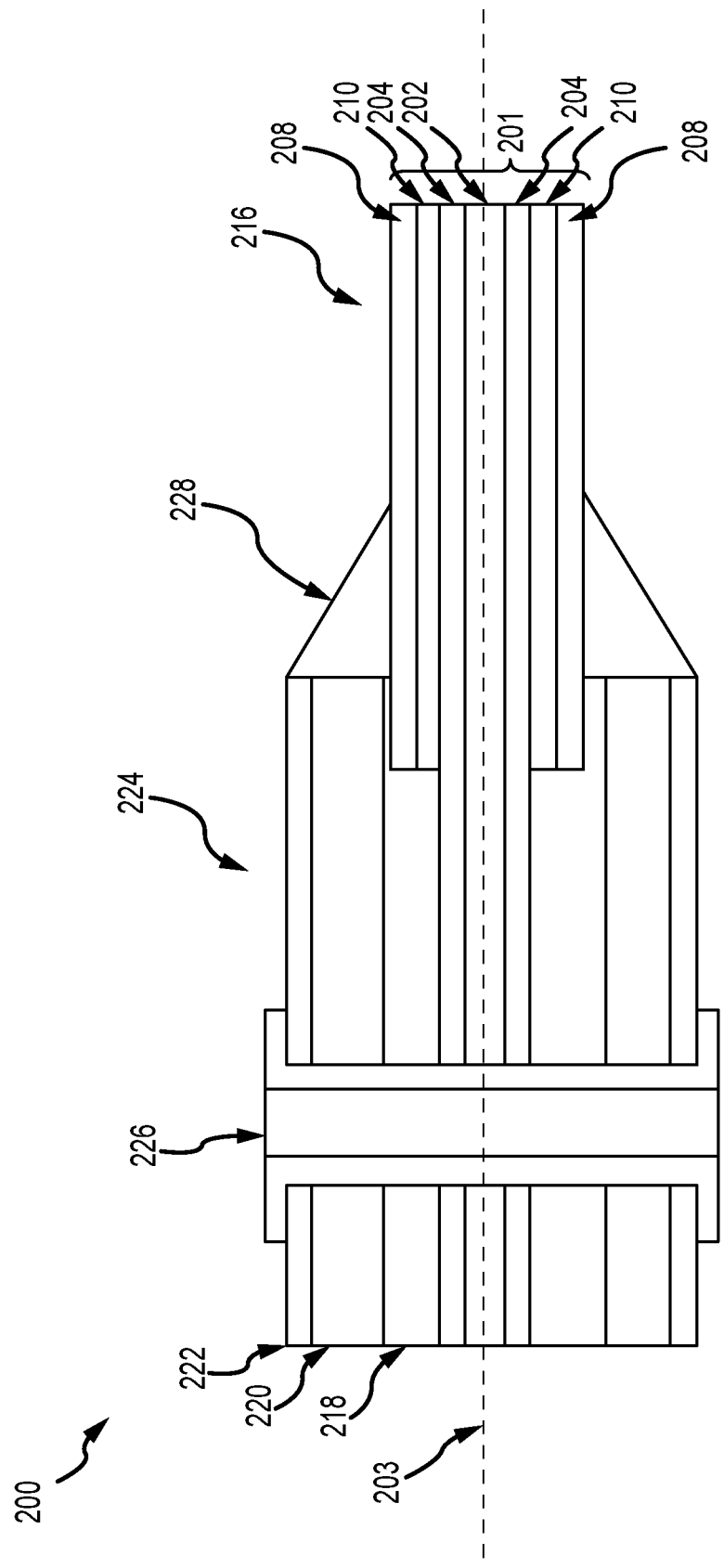
FIGS. 7a through 7c are side section views of different embodiments of the flex circuit using single substrate, multi-substrate bonded and multi-substrate loose leaf structures.
Figure 7B:
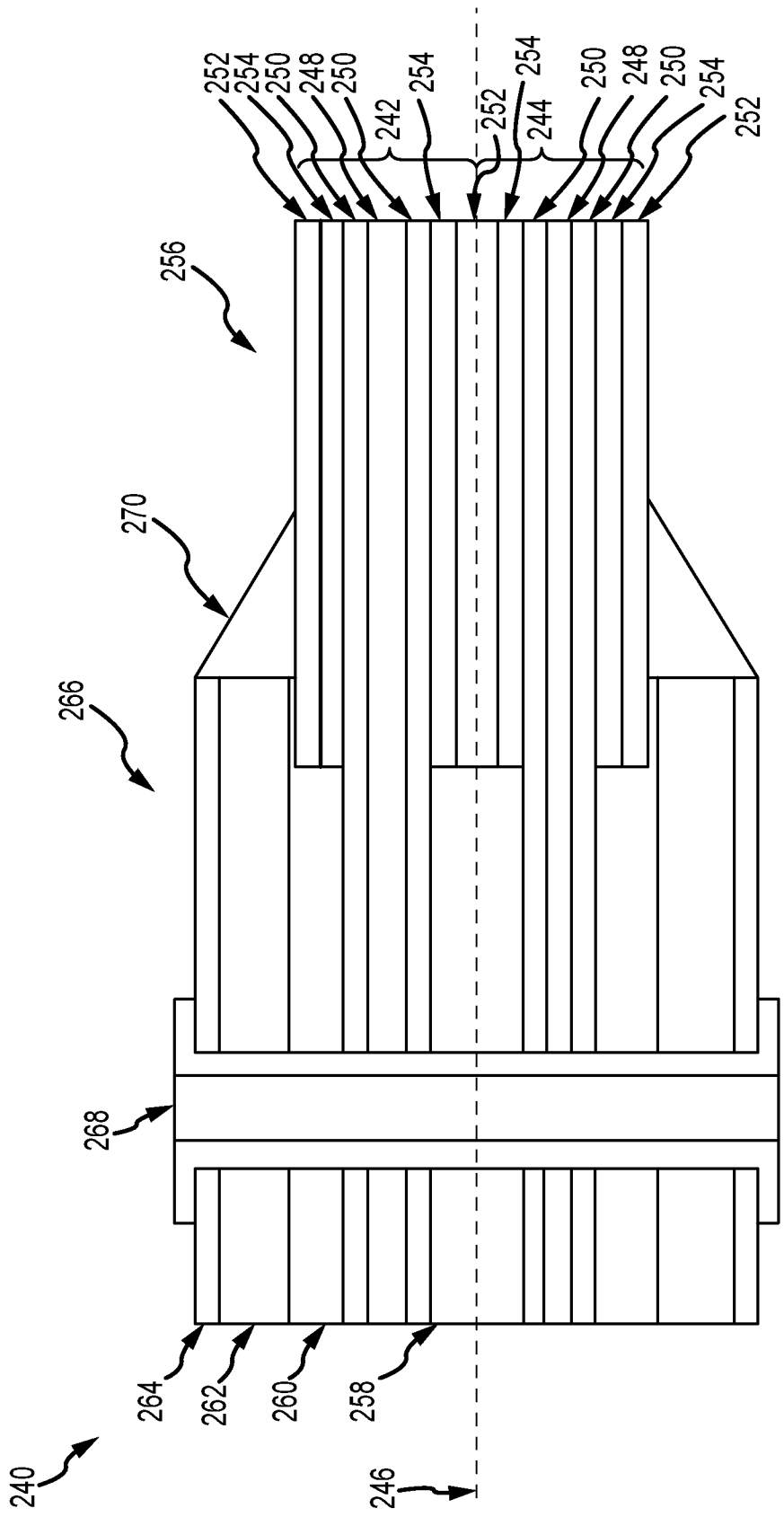
Figure 7C:
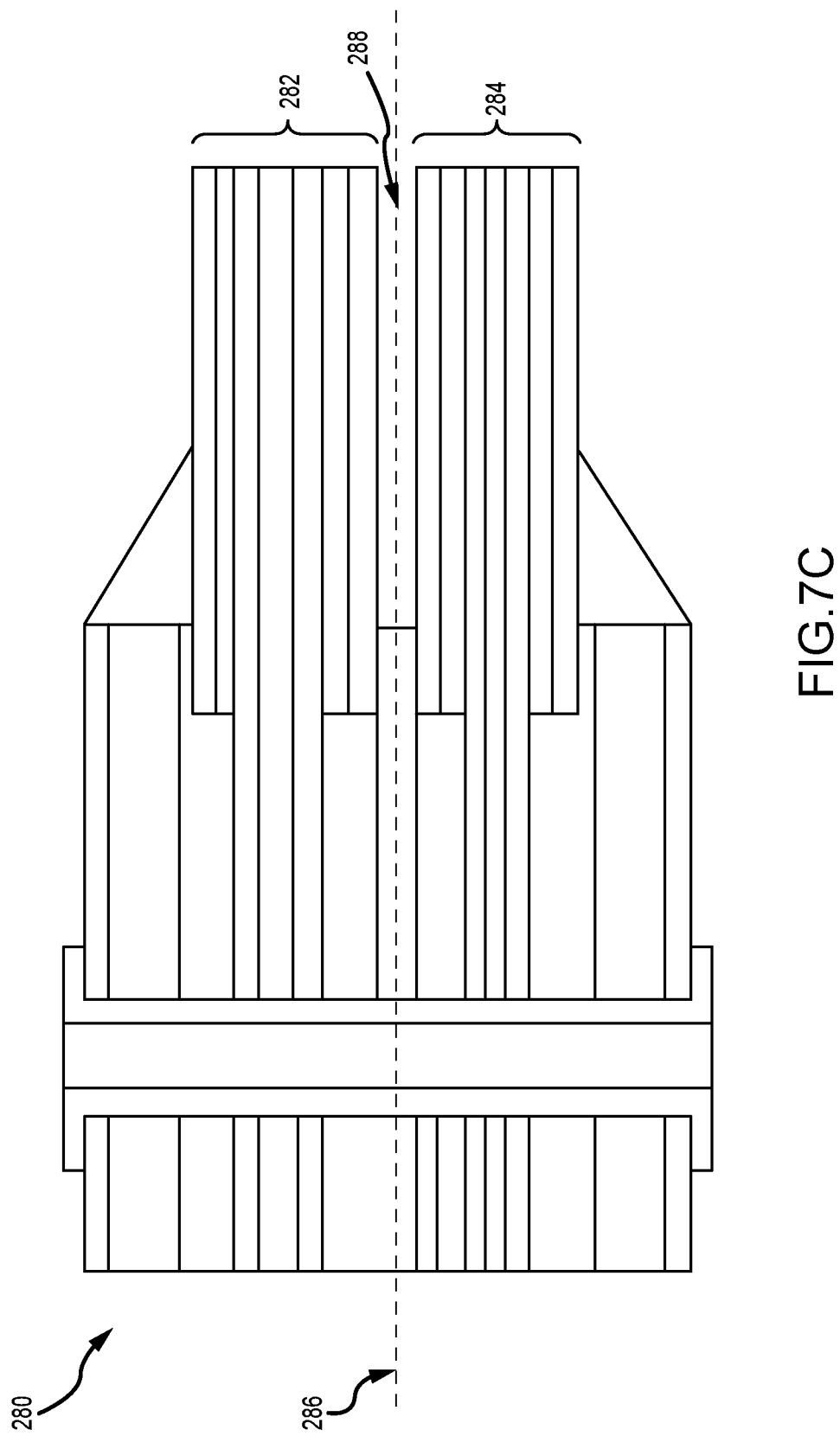

Referring now to FIGS. 7a through 7c, the flex circuit and rigid platform may be integrally formed using various types of flexible printed board configurations. In each of these embodiments, the multi-layer structure is symmetrical about a centerline of the isolator with the possible exception of patterning differences to, for example, define the conductive traces and through holes. This symmetry about the centerline serves to balance the construction.

As shown in FIG. 7a, a vibration isolator 200 is formed with a single substrate 201 of a Type 1 or Type 2 flex on a centerline 203. The substrate 201 comprises a base polymer layer 202 having patterned conductive layers 204 on opposing surfaces that extend the entire length of the isolator. Axial portions of the substrate are sandwiched between covering polymer layers 208 (insulating layers) using adhesive layers 210 to form the flex circuits 216. A central portion of the substrate is sandwiched between a pre-preg layer 218, a rigid layer 220 and a conductive layer 222 to form a rigid platform 224. PTHs 226 extend through the structure to provide electrical contacts for the supported circuit. A fillet bead 228 is provided for stress relief.

As shown in FIG. 7b, a vibration isolator 240 is formed with a pair of bonded substrates 242 and 244 of a Type 4 flex about a centerline 246. The bonded construction can be used to provide additional stiffness. Each substrate comprises a base polymer layer 248 having patterned conductive layers 250 on opposing surfaces that extend the entire length of the isolator. Axial portions of the substrate are sandwiched between covering polymer layers 252 (insulating layers) using adhesive layers 254 to form the flex circuits 256. In the bonded construction, the substrates 242 and 244 share a common covering polymer layer. A central portion of each substrate is sandwiched between on one side a pre-preg layer 258 and on the other side a pre-preg layer 260, a rigid layer 262 and a conductive layer 264 to form a rigid platform 266. PTHs 268 extend through the structure to provide electrical contacts for the supported circuit. A fillet bead 270 is provided for stress relief.

As shown in FIG. 7c, a vibration isolator 280 is formed with a pair of loose-leaf substrates 282 and 284 of a Type 4 flex about a centerline 286. In this case, substrates 282 and 284 are not bonded by a common polymer layer but are spaced apart to provide an air gap 288. This air gap may be used to increase damping and tune isolator performance.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A vibration isolator, comprising:
   a support structure and a supported circuit of at most 100 grams disposed face to face and spaced apart;
   a platform that supports the supported circuit;
   a plurality of flex circuits, each flex circuit including at least one insulating polymer layer, at least one of the plurality of flex circuits including a patterned conductive layer, one end of each of the plurality of flex circuits terminating at the platform; and
   a plurality of connectors affixed to the opposite ends of the plurality of flex circuits, respectively, and the support structure at positions beneath the platform,
   said plurality of flex circuits extending between the support structure at the positions beneath the platform and opposing sides of the platform to form opposing loops to support the platform and provide electrically isolated conductive paths between the support structure and the supported circuit that carry power or at least one signal to or from the supported circuit,
   wherein said plurality of flex circuits provide isolation of the supported circuit from dynamic mechanical inputs at frequencies above an isolation frequency of the vibration isolator.

2. The vibration isolator of claim 1, wherein the supported circuit is at most 50 grams.

3. The vibration isolator of claim 1, wherein the isolation frequency is at least 50 Hz.

4. The vibration isolator of claim 1, wherein each of said flex circuits has an identical composition of at least one said insulating polymer layer and at least one said patterned conductive layer.

5. The vibration isolator of claim 4, wherein the electrically isolated conductive paths provided by the patterned conductive layer on at least one of the flex circuits are inactive.

6. The vibration isolator of claim 1, wherein electrically isolated conductive paths on different flex circuits carry power to the supported circuit and the at least one signal to or from the supported circuit, respectively.

7. The vibration isolator of claim 1, wherein at least one of the plurality of flex circuits does not include a patterned conductive layer, where that flex circuit's at least one said insulating polymer layer is configured to have the same stiffness parameters as the other flex circuits that include at least one said patterned conductive layer.

8. The vibration isolator of claim 1, wherein the platform, each of the plurality of flex circuits and the connectors are integrally formed from a stack including the at least one said insulating polymer layer and the at least one said patterned conductive layer, and at least one patterned rigid layer that defines the platform and the connectors.

9. The vibration isolator of claim 8, wherein said flex circuits are Type 4 printed boards that include multilayer rigid and flexible material combinations containing three or more patterned conductive layers with electrical contacts integrally formed in the stack.

10. The vibration isolator of claim 9, wherein the stack includes multiple polymer layers in either a loose leaf or bonded configuration.

11. The vibration isolator of claim 1, wherein each loop has a bend radius of at least 10 times the thickness of the flex circuit.

12. The vibration isolator of claim 1, wherein each loop forms a U-shaped bend.

13. The vibration isolator of claim 1, wherein the platform includes a central portion of the plurality of flex circuits sandwiched between first and second rigid layers, sandwiched between first and second conductive layers and a plurality of electrical contacts that extend through the rigid platform to the patterned to carry power or the at least one signal to and from the supported circuit.

14. An integrally formed vibration isolator to isolate a supported circuit of at most 100 grams from a support structure, comprising:
   a stack including at least one insulating polymer layer, at least one patterned conductive layer and at least one patterned rigid layer defining an integrally-formed rigid platform to support the supported circuit, a plurality of rigid mechanical connectors and a plurality of flex circuits integrally terminated at one end in the platform and at opposing ends in the respective rigid mechanical connectors, said rigid platform including a plurality of electrical contacts integrally terminated to the at least one patterned conductive layer,
   wherein said flex circuits are bendable to extend from the platform in at least partly curved paths to provide at least two opposing bends to isolate the supported circuit from the support structure from dynamic mechanical inputs at frequencies above an isolation frequency of the vibration isolator and carry power or at least one signal to or from the supported circuit.

15. The vibration isolator of claim 14, wherein said flex circuits are Type 4 printed boards that include multilayer rigid and flexible material combinations containing three or more patterned conductive layers with electrical contacts integrally formed in the stack.

16. The vibration isolator of claim 14, wherein the flex circuits are bent to form opposing loops and the mechanical connectors are affixed to the support structure beneath the platform.

17. The vibration isolator of claim 16, wherein each loop forms a U-shaped bend having a bend radius of at least 10 times the thickness of the flex circuit.

18. A method of isolating a supported circuit from a support structure, said method comprising:
   integrally fabricating a vibration isolator by
      providing a stack including at least one insulating polymer layer and at least one patterned conductive layer;
      patterning at least one rigid layer on a central portion of the stack to integrally form a rigid platform and a plurality of rigid mechanical connectors;
      forming at least one covering polymer layer over the at least one patterned conductive layer between the platform and the mechanical connectors to form a plurality of flex circuits integrally terminated at one end in the rigid platform and at an opposing ends in the respective rigid mechanical connectors, and
      forming a plurality of electrical contacts in the rigid platform that are integrally terminated to the at least one patterned conductive layer;

mounting the supported circuit on the rigid platform;

affixing the rigid mechanical connectors to the support structure at positions beneath the platform to bend the plurality of flex circuits to form opposing loops to support and isolate the supported circuit from dynamic mechanical inputs at frequencies above an isolation frequency, said at least one patterned conductive layer and plurality of electrical contacts providing electrically isolated conductive paths between the support structure and the supported circuit that carry power or at least one signal to or from the supported circuit.

19. The method of claim 18, wherein each loop forms a U-shaped bend having a bend radius of at least 10 times the thickness of the flex circuit.

20. An vibration isolator to isolate a supported circuit of at most 100 grams from a support structure, comprising:

one or more substrates in a stack, each substrate comprising a base polymer layer sandwiched between first and second patterned conductive layers;

a central portion of the one or more substrates further comprising first and second rigid layers on opposing sides of the one or more substrates and first and second conductive layers on opposing sides of the first and second rigid layers to form a rigid platform, a plurality of electrical contacts that extend through the rigid platform to the first and second patterned conductive layers to carry power and at least one signal to and from the supported circuit; and a plurality of axial portions of the one or more substrates that extend axially from the central region, said axial portions sandwiched between first and second insulating polymer layers to form a plurality of flex circuits;

a plurality of end portions of the flex circuits sandwiched between the first and second layers to form rigid mechanical connectors;

wherein said flex circuits are bendable to extend from the rigid platform in at least partly curved paths and mechanically terminated to the support structure to provide at least two opposing bends to isolate the supported circuit from the support structure from dynamic mechanical inputs at frequencies above an isolation frequency of the vibration isolator.

21. The vibration isolator of claim 20, in which the stack incudes a single substrate, the central portion of the single substrate is sandwiched between first and second pre-preg layers, the first and second rigid layers and the first and second conductive layers to form the rigid platform.

22. The vibration isolator of claim 21, wherein the single substrate is a Type 1 or Type 2 flex circuit.

23. The vibration isolator of claim 20, in which the stack incudes a pair of substrates positioned about a centerline, the central portion of each substrate is sandwiched between a pre-preg layer towards the centerline and a pre-preg layer, one of the first and second rigid layers and one of the first and second conductive layers away from the centerline to form the rigid platform.

24. The vibration isolator of claim 23, wherein each substrate is a Type 4 flex circuit.

25. The vibration isolator of claim 23, wherein the pair of substrates are bonded about the centerline.

26. The vibration isolator of claim 23, wherein the pair of substrates are loose-leaf substrates spaced apart about the centerline.

27. The vibration isolator of claim 20, wherein the partly curved paths form opposing loops, each loop forming a U-shaped bend having a bend radius of at least 10 times the thickness of the flex circuit.

\* \* \* \* \*